(12) United States Patent
Lenzie et al.

(10) Patent No.: US 7,852,090 B2
(45) Date of Patent: Dec. 14, 2010

(54) APPARATUS, SYSTEM AND METHODS FOR GROUND CURRENT DETECTION

(75) Inventors: Kirk Lenzie, Aurora, CO (US); Casey Gold, Parker, CO (US); Vincent Nguyen, Castle Rock, CO (US); Sam Chaisitti, Westminster, CO (US)

(73) Assignee: EchoStar Technologies L.L.C., Englewood, CO (US)

( * ) Notice: Subject to any disclaimer, the term of this patent is extended or adjusted under 35 U.S.C. 154(b) by 417 days.

(21) Appl. No.: 12/032,883

(22) Filed: Feb. 18, 2008

(65) Prior Publication Data

US 2009/0085576 A1    Apr. 2, 2009

Related U.S. Application Data

(60) Provisional application No. 60/976,694, filed on Oct. 1, 2007.

(51) Int. Cl.
*G01R 31/00* (2006.01)
*H02H 3/00* (2006.01)

(52) U.S. Cl. .................... 324/508; 324/509; 361/46; 361/50; 361/93.6

(58) Field of Classification Search ......... 324/508–511; 361/42–50, 93.6
See application file for complete search history.

(56) References Cited

U.S. PATENT DOCUMENTS

| | | | | |
|---|---|---|---|---|
| 3,857,096 A | * | 12/1974 | Gregory | 324/127 |
| 4,438,477 A | * | 3/1984 | Cawley | 361/119 |
| 4,688,134 A | | 8/1987 | Freeman et al. | |
| 4,807,083 A | * | 2/1989 | Austin | 361/111 |
| 4,999,729 A | * | 3/1991 | Stifter | 361/56 |
| 5,053,910 A | * | 10/1991 | Goldstein | 361/111 |
| 5,757,598 A | | 5/1998 | Aromin | |
| 5,808,470 A | * | 9/1998 | Adams et al. | 324/510 |
| 5,844,764 A | * | 12/1998 | Meyerhoefer et al. | 361/111 |
| 6,052,266 A | | 4/2000 | Aromin | |
| 6,122,155 A | | 9/2000 | Aromin et al. | |
| 6,212,048 B1 | * | 4/2001 | Chaudhry | 361/42 |
| 6,775,121 B1 | * | 8/2004 | Chaudhry | 361/111 |
| 6,991,495 B1 | | 1/2006 | Aromin | |
| 7,375,940 B1 | * | 5/2008 | Bertrand | 361/46 |

* cited by examiner

*Primary Examiner*—Timothy J Dole
(74) *Attorney, Agent, or Firm*—Max S. Gratton

(57) ABSTRACT

Various systems, methods and apparatus are described for detecting an excessive or faulty ground current in a conductive wire or electronic device. A ground current detector is coupled to a known earth ground to determine whether other ground lines are carrying excessive, faulty and/or leaking currents. If these types of unsafe conditions are detected, then a user can take appropriate action to locate and correct these problems.

4 Claims, 10 Drawing Sheets

US 7,852,090 B2

APPARATUS, SYSTEM AND METHODS FOR GROUND CURRENT DETECTION

RELATED APPLICATIONS

This application claims the benefit of U.S. Provisional Application No. 60/976,694, entitled "Apparatus, System and Methods for Ground Current Detection", filed on Oct. 1, 2007, which is hereby incorporated by reference in its entirety.

BACKGROUND

Satellite dishes and other electrical devices are often connected to an earth ground for safety reasons. For example, a set-top box chassis is typically connected to a ground block of a home through a coaxial cable. However, if the home has a problem with its electrical system, such as faulty wiring, then potentially hazardous currents may flow through the chassis and into the coaxial cable. These currents can be damaging to the set-top box and may cause injury to people coming in contact with the set-top box or the coaxial cable.

Ground fault circuit interrupters (GFCI) are known in the art for detecting an imbalance of current between a hot line and a neutral line of standard home wiring. Faulty currents can be caused by a variety of different problems. A poor connection to earth ground at the neutral tie block of the home's power system may cause the majority of the home's current to exit through the coaxial cable instead of the AC ground line. While GFCIs can detect some ground fault conditions, they are inadequate for detecting other types of fault currents. Other problems may be caused by leakage current or incorrect wiring among A/V equipment, or the ground line being connected to the line potential (i.e., the hot line). These and other problems are not detectable by GFCIs, and hence, GFCIs are inadequate for utilization of detection of faults during satellite television installations.

BRIEF DESCRIPTION OF THE DRAWINGS

The same number represents the same element or same type of element in all drawings.

DETAILED DESCRIPTION

The various embodiments described herein generally provide apparatus, systems and methods for detecting excess or faulty currents that may be flowing through a conductive wire or electronic device. More particularly, in at least one embodiment faulty or excessive currents are detected in a ground conductor of an alternating current (AC) power system. In at least one embodiment, excessive or faulty currents are detected in a connection of a communications system (e.g., a coaxial cable of a television system). In short, the various embodiments described herein provide ground current detection apparatus, system and/or methods.

For testing/monitoring purposes, a current may be detected in a ground conductor, conductive wire or electronic device that is in excess of a specified threshold. The detection process may be performed relative to a known earth ground. In at least one embodiment, the known earth ground connection is a coaxial cable coupled to or in signal communication with a ground block of a structure. The threshold may be specified as a current level that is accepted as generally safe (e.g., 5 mA), or may be specified as any level selected based on desired design criteria, such as a capacity of the conductive wire or device. In at least one embodiment, an indicator is provided to a user, responsive to detecting a current in a conductor that exceeds a specified threshold. The connection to the conductor may also be broken responsive to detecting a current in the conductor that exceeds a specified threshold. The apparatus, systems and methods described herein may also be configured, in other embodiments, to provide other testing, monitoring and detection of faulty or excessive currents and the like.

Figure 1:
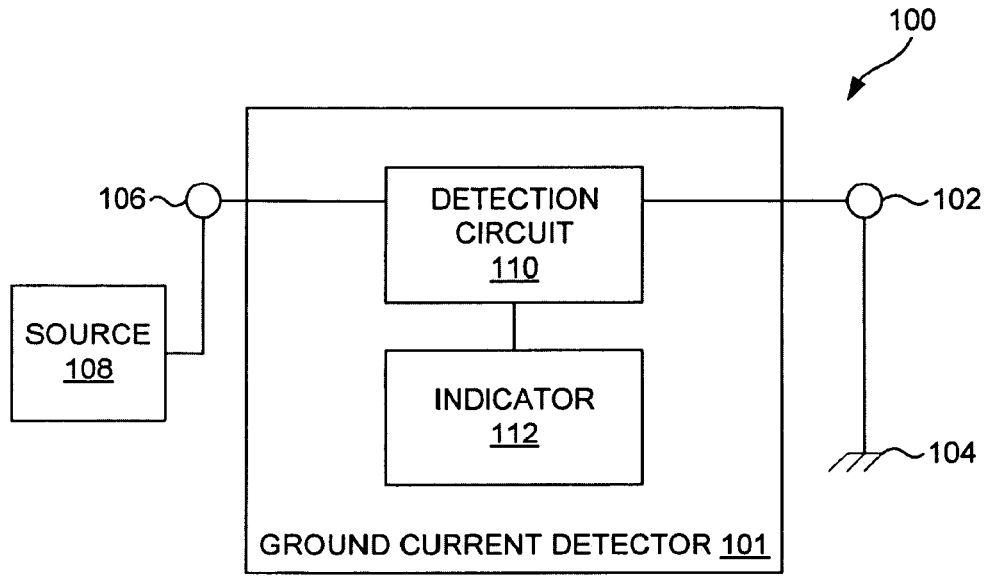
FIG. 1 illustrates an embodiment of a testing/monitoring environment.

FIG. 1 illustrates a testing/monitoring environment 100. More particularly, FIG. 1 illustrates an embodiment of the components of a ground current detector 101. The ground current detector 101 includes a first input 102 in signal communication with an earth ground 104. In at least one embodiment, the first input 102 is a coaxial cable connector (e.g., a female F-connector) communicatively coupled to the earth ground 104 through a coaxial cable and/or a ground block. In at least one embodiment, the coaxial cable may be further communicatively coupled to a television signal source, such as a satellite antenna or a cable television distribution system. It is to be appreciated that the first input 102 may also be coupled to the earth ground 104 through any type of wiring or connection.

The ground current detector 101 further includes a second input 106 in signal communication with a current or signal source 108. The second input 106 and the source 108 may be communicatively coupled through any type of connection. For example, the source 108 may comprise an AC power supply, and the second input 106 may be a three-prong AC plug coupled to an outlet of the AC power supply. More particularly, in at least one embodiment, the second input 106 may be coupled to the ground line of a three-prong plug connected to the outlet of the AC power supply.

In at least one embodiment, the second input 106 is a coaxial jack coupled to a coaxial cable of a television distribution system (e.g., a cable television or satellite distribution system). More particularly, the second input 106 may be coupled to or in signal communication with any type of audio/visual (A/V) device, such as a television, stereo, set-top box, and the like. It is to be appreciated that other types of electronic devices and sources 108 may be connected to the second input 106. For example, the second input 106 may be communicatively coupled to a cable modem and the like.

The ground current detector 101 further includes a detection circuit 110. The detection circuit 110 receives a signal from the second input 106, and determines whether a value of a current of the signal is above a threshold value, based on the earth ground 104. The threshold value may identify an excessive or faulty current flowing from source 108. For example, the threshold value may be selected as approximately 5 mA. Many safety organizations consider 5 mA to be the maximum current value safe for human touch by the average person. However, many people are able to safely let go of an energized wire that carries more than 5 mA of current. Thus, it is to be appreciated that other threshold values may be selected based on selected design criteria, such as safety concerns, equipment limitations and the like. Thus, the threshold value may be selected as greater than 5 mA if that amount of current is considered safe for transmission from the source 108 or through intermediate wires, cabling, devices, or systems.

In at least one embodiment, a signal having a current exceeding the threshold value may indicate an excessive current detected by the detection circuit 110, that is greater that what is normally expected to flow from the source 108. For example, this may indicate a surge emanating from or flowing through the source 108. In at least one embodiment, a signal having a current greater than the threshold value may indicate a faulty current detected by the detection circuit 110 that is not normally expected to flow from the source. For example, this may indicate that a ground line of an AC wall outlet is incorrectly connected to the line potential of the main breaker for the structure.

The ground current detector 101 further includes an indicator 112 coupled to the detection circuit 110 that provides an indication to a user that the value of a current flowing through the ground current detector 101 is above the threshold value. In at least one embodiment, the indicator 112 comprises a light emitting diode (LED) or the like that is activated (turned-on) or deactivated (turned-off) responsive to the detection circuit 110 detecting a current above the threshold value. A user may then take corrective action to remedy the faulty or excessive current detected by the ground current detector 101. It is to be appreciated that other types of visual, audible or other indications may also be provided by indicator 112. For example, the states of the LED described above may be reversed, or the indicator 112 may comprise a liquid crystal display (LCD) that indicates the value of the current detected by the detection circuit 110.

In short, the ground current detector 101 includes the first input 102 in signal communication with the earth ground 104, and the second input 106 in signal communication with the source 108, which in at least one embodiment is a ground line of a power source. The ground current detector 101 also includes the detection circuit 110 that is communicatively coupled to the first input 102 and the second input 106, and which receives a signal from the second input 106 and determines whether a value of a current of the signal is above a threshold value based on the earth ground 104. Testing/monitoring environment 100 and ground current detector 101 may include other components or elements not illustrated for the sake of brevity.

Figure 2:
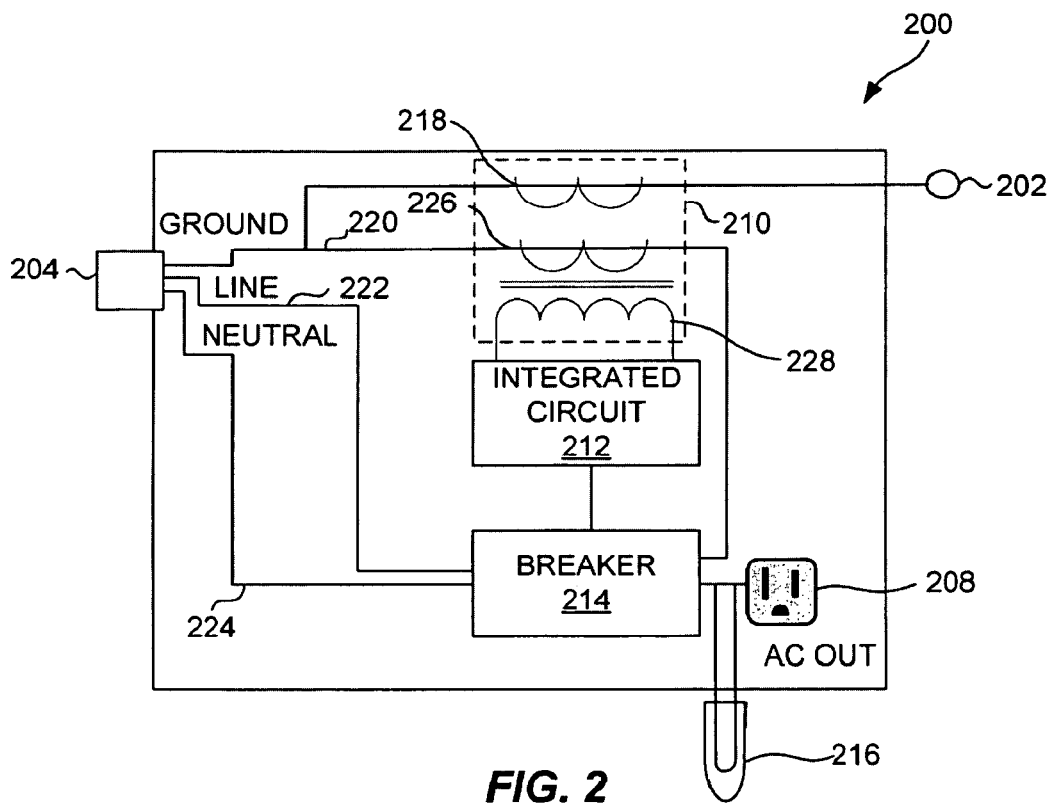
FIG. 2 illustrates an embodiment of a ground current detector.

FIG. 2 illustrates an embodiment of a ground current detector 200. In this embodiment, ground current detector 200 is configured to determine whether an excess or faulty current is flowing from a wall outlet or an electronic device (e.g., a set-top box). Ground current detector 200 includes a coaxial input 202, an AC input 204, an AC output 208 (e.g., a power output), a transformer 210, an integrated circuit 212, a breaker 214 and an indicator 216. Each of these components will be discussed in greater detail below.

A first end of the coaxial input 202 is communicatively coupled to an earth ground through a coaxial cable. In at least one embodiment, the coaxial cable is communicatively coupled to a satellite antenna utilized in a satellite television distribution system. The coaxial cable connected to coaxial input 202 may be coupled to the earth ground through a ground block or the like. The coaxial input 202 thus represents a known or true earth ground potential to the ground current detector 200. A second end of the coaxial input 202 is communicatively coupled to the first primary windings 218 of the transformer 210. The functionality of the transformer 210 will be discussed in greater detail below.

The AC input 204 of the ground current detector 200 may be coupled to an AC power source, such as a three-prong wall outlet. In at least one embodiment, the AC input 204 comprises a three-prong AC plug for insertion into an AC wall outlet. The AC input 204 is communicatively coupled to an AC ground conductor 220, a line conductor 222 and a neutral conductor 224. The AC ground conductor 220 is communicatively coupled to the second primary windings 226 of the transformer 210. The AC ground conductor 220 is further communicatively coupled to the first primary windings 218.

In at least one embodiment, the first primary windings 218 (coupled to the earth ground), the second primary windings 226 (coupled to the AC ground) and the secondary windings 228 of the transformer 210 may be configured as current transformers. In at least one embodiment, the first primary windings 218 and the second primary windings 226 may be electrically isolated with respect to each other, such that a faulty or excessive current in either ground path may be detected by the ground current detector 200.

The transformer 210 operates to provide a current in the secondary windings 228 that is proportional to the current flowing in primary windings 218 and/or 226. Likewise, a voltage is induced in secondary windings 228 that is proportional to the current in secondary windings 228. The proportional voltage induced in secondary windings 228 is utilized to provide a voltage to integrated circuit 212. Integrated circuit 212 monitors the input voltage to determine whether any of the signals or currents flowing into ground conductor 220 or coaxial output 206 are faulty and/or excessive.

The integrated circuit 212 compares the input voltage to a threshold value to determine whether a current in the primary windings 218 and/or 226 is greater than the specified value. A typical threshold value may be selected as approximately 5 mA. Currents above this threshold value are regarded as hazardous and potentially lethal. However, it is to be appreciated that other current threshold values may be utilized that are higher or lower depending on desired design criteria.

The breaker 214 is coupled to AC output 208. In at least one embodiment, the AC output 208 is a three-prong AC outlet configured to receive an AC plug of an electronic device (e.g., a set-top box). The breaker 214 may also be coupled to the AC conductor 220, the line conductor 222 and the neutral conductor 224. Thus, an electronic device may then be powered during the testing/monitoring process using a current emanating from AC output 208.

In at least one embodiment, the integrated circuit 212 trips the breaker 214 responsive to detecting a current in the AC ground conductor 220 that is greater than the threshold value. The tripping of the breaker 214 de-energizes the AC output 208. Additionally, the indicator 216 may be activated (or deactivated) to indicate the tripping of the breaker and detection of the excessive or faulty current. In at least one embodiment, the indicator 216 is an LED that is energized if the conditions detected by the integrated circuit 212 are safe, and de-energized if the conditions detected by the integrated circuit 212 are unsafe. The indicator 216 may be energized by the current flowing from the breaker 214 into the AC output 208, and alerts a user to the presence of unsafe electrical conditions so that the user can take corrective action. Ground current detector 200 may include other components or elements not illustrated for the sake of brevity.

Figure 3:
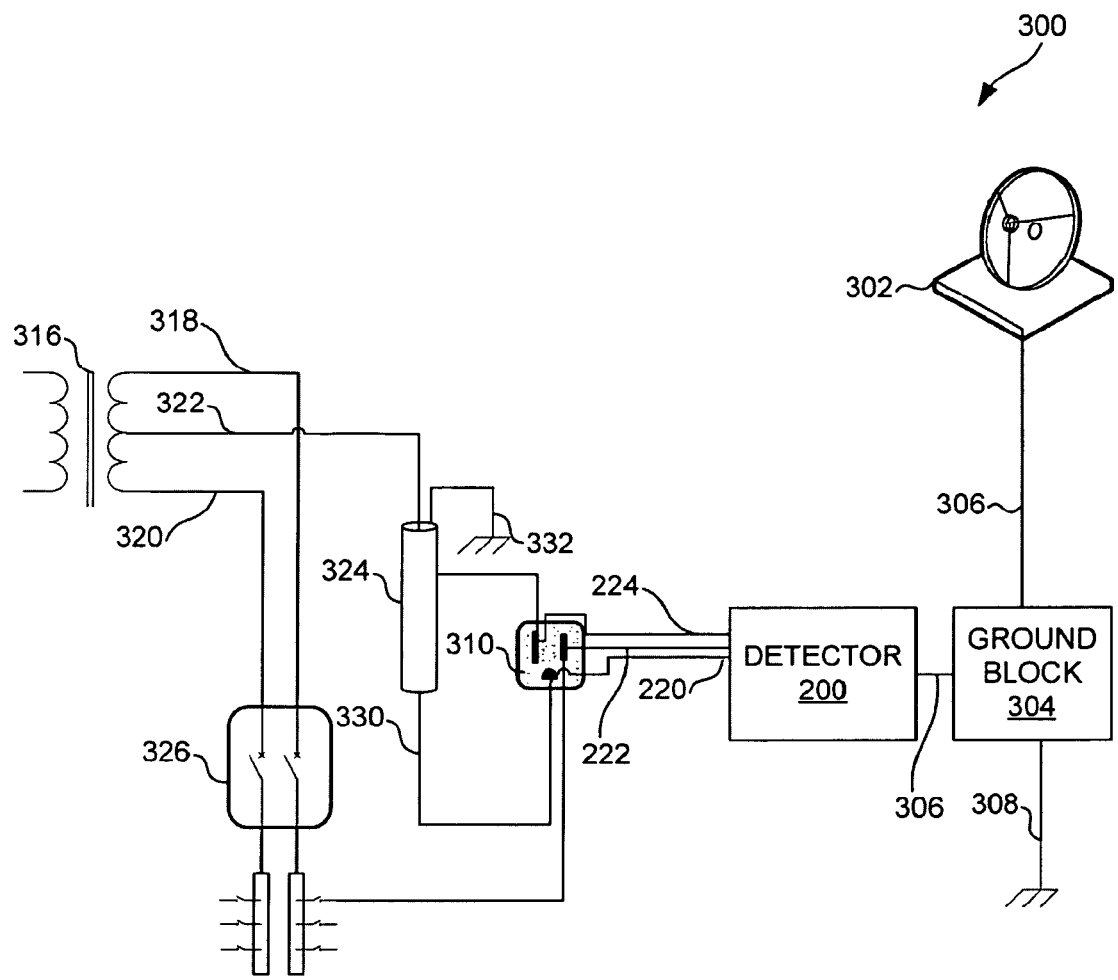
FIG. 3 illustrates an embodiment of a testing/monitoring environment utilizing the ground current detector of FIG. 2.

FIG. 3 illustrates an embodiment of a testing/monitoring environment 300 utilizing ground current detector 200. The testing/monitoring environment 300 is discussed in reference to a satellite television installation, and will be discussed in reference to ground current detector 200 illustrated in FIG. 2. The ground current detector 200 allows for testing/monitoring of the wiring within a typical structure to locate faulty or excessive currents during a satellite television installation.

The testing/monitoring environment 300 includes a satellite antenna 302 which is electrically grounded to an earth ground 308. More specifically, a coaxial cable 306 is electrically grounded to the earth ground 308 through a ground block The satellite antenna 302 is electrically coupled to the coaxial cable, and thus, electrically coupled to the potential of the earth ground 308.

The coaxial cable 306 is further connected to the ground current detector 200. More specifically, the coaxial cable 306 is coupled to the coaxial input 202 (see FIG. 2) of ground current detector 200. The ground current detector 200 is further electrically coupled to an AC wall outlet 310. More specifically, AC input 204 (see FIG. 2) of the ground current detector 200 is plugged into the AC wall outlet 310, connecting ground conductor 220, line conductor 222 and neutral conductor 224 to the wiring system of the structure.

The neutral receptacle of the AC wall outlet 310 is electrically coupled to the neutral tie block 324 of the structure. A ground receptacle of the AC wall outlet 310 is also electrically coupled to the neutral tie block 324 through a neutral connection 330. The neutral tie block 324 is electrically coupled to the ground 332, placing the neutral tie block 324 at a ground potential. The ground 332 is typically earth grounded (e.g., at an earth ground potential), but it is to be appreciated that mis-wiring in a structure may occur, and thus, ground 332 may not be at the same potential as earth ground 308. The neutral tie block 324 is further connected to a main distribution transformer 316 through a neutral line connection 322.

Main distribution transformer 316 is electrically coupled to two line conductors 318 and 320. These are also known as hot conductors, and carry current into the structure from the main distribution transformer 316. The two line conductors 318 and 320 are connected to a main breaker 326. A hot receptacle of the AC wall outlet 310 is connected to one of the two line conductors 318 or 320 through main breaker 326.

When connected to the AC wall outlet 310, the ground current detector 200 may be utilized to test for mis-wiring within the structure. As described above, the ground current detector 200 may monitor the ground conductor 220 to detect the presence of faulty or excessive currents, which may have a value exceeding a specified threshold. Because ground current detector 200 is coupled to the known earth ground 308, excessive or faulty currents in ground conductor 220, including faulty earth ground connections to neutral tie block 324, may be detected.

Testing/monitoring environment 300 may include other components or elements not illustrated for the sake of brevity. While testing/monitoring environment 300 has been illustrated in the context of installing a satellite television system, it is to be appreciated that the ground current detector 200 may be utilized during the set-up and installation of other electronic systems. For example, a coaxial cable utilized during a cable television installation may be utilized with the ground current detector 200 if the coaxial cable is electrically coupled to an earth ground connection. It is also to be appreciated that other wiring techniques may be utilized to electrically couple the ground current detector 200 to an earth ground connection for purposes of testing the wiring of AC wall outlet 310. Further, ground current detector 300 may be temporarily installed during an installation process, or may be permanently installed for utilization in ongoing monitoring of the testing/monitoring environment 300.

Figure 4:
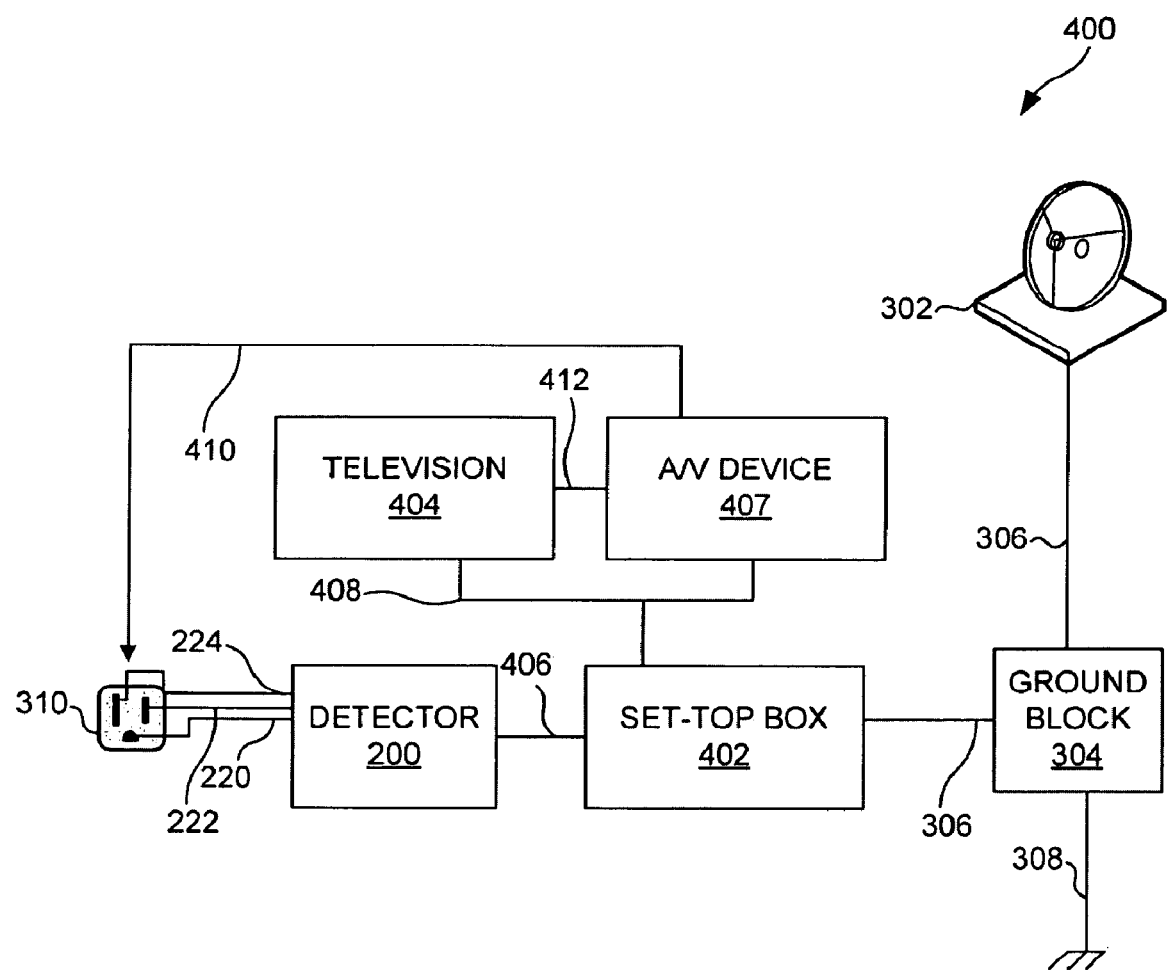
FIG. 4 illustrates an embodiment of a testing/monitoring environment utilizing the ground current detector of FIG. 2.

In addition to testing and/or monitoring the wiring of AC wall outlet 310, the ground current detector 200 may also be utilized to test for faulty or excessive ground currents caused by electronic devices, such as stray or leakage currents from A/V devices coupled to a set-top box. FIG. 4 illustrates an embodiment of a testing/monitoring environment 400 utilizing ground current detector 200 for testing/monitoring purposes. The testing/monitoring environment 400 is discussed in reference to a satellite television installation, and will be discussed in reference to ground current detector 200 illustrated in FIG. 2. The description of elements common to the testing/monitoring environment 300 of FIG. 3 is omitted for brevity of the discussion.

The testing/monitoring environment 400 includes a set-top box 402 that is in signal communication with the satellite antenna 302 through the coaxial cable 306. More specifically, the coaxial cable 306 is connected to a satellite signal input of the set-top box 402. Because the coaxial cable 306 is electrically grounded to the earth ground 308, the coaxial input of the set-top box 402 is at an earth ground potential.

A power plug 406 of the set-top box 402 is inserted into an AC output 208 (see FIG. 2) of the ground current detector 200. The ground current detector 200 energizes the set-top box 402 using current drawn from the AC wall outlet 310.

The testing/monitoring environment 400 further includes a television 404 and an A/V device 407 (e.g., a DVD player). The television 404 may be in signal communication with the set-top box 402 through an A/V connection 408, such as a coaxial cable, a composite video connection or a high definition multimedia interface (HDMI) connection. The set-top box 402 may be further communicatively coupled with the A/V device 407 through the same A/V connection 408 connected to the television 404, or a different A/V connection. In at least one embodiment, the television 404 and the A/V device 407 may be connected via an A/V connection 412. The A/C power plugs of the television 404 and the A/V device 407 may be plugged into the wall outlet 310.

In some situations, the television 404 and/or A/V device 407 may generate leakage currents which flow into set-top box 402. These are the result of mis-wiring or faulty connections within the testing/monitoring environment 400, and pose potential safety concerns to users of the set-top box 402 as well as the equipment itself. These leaking currents from television 404 and/or A/V device 407 pass into set-top box 402 and exit the set-top box 402 through the ground conductor of the AC power plug of set-top box 402 or the coaxial cable 306.

Because the AC power plug 406 of the set-top box 402 is connected to the ground current detector 200, the ground current detector 200 will detect any of the faulty, excessive or leaking currents in the ground conductor of the AC power plug 406. As described above, the integrated circuit 212 (see FIG. 2) of the ground current detector 200 may then trip the breaker 214, activate the indicator 216, or provide other indicators to a user indicating the presence of these faulty conditions. A user may then take corrective action to troubleshoot the problem and eliminate the faulty condition.

Figure 5:
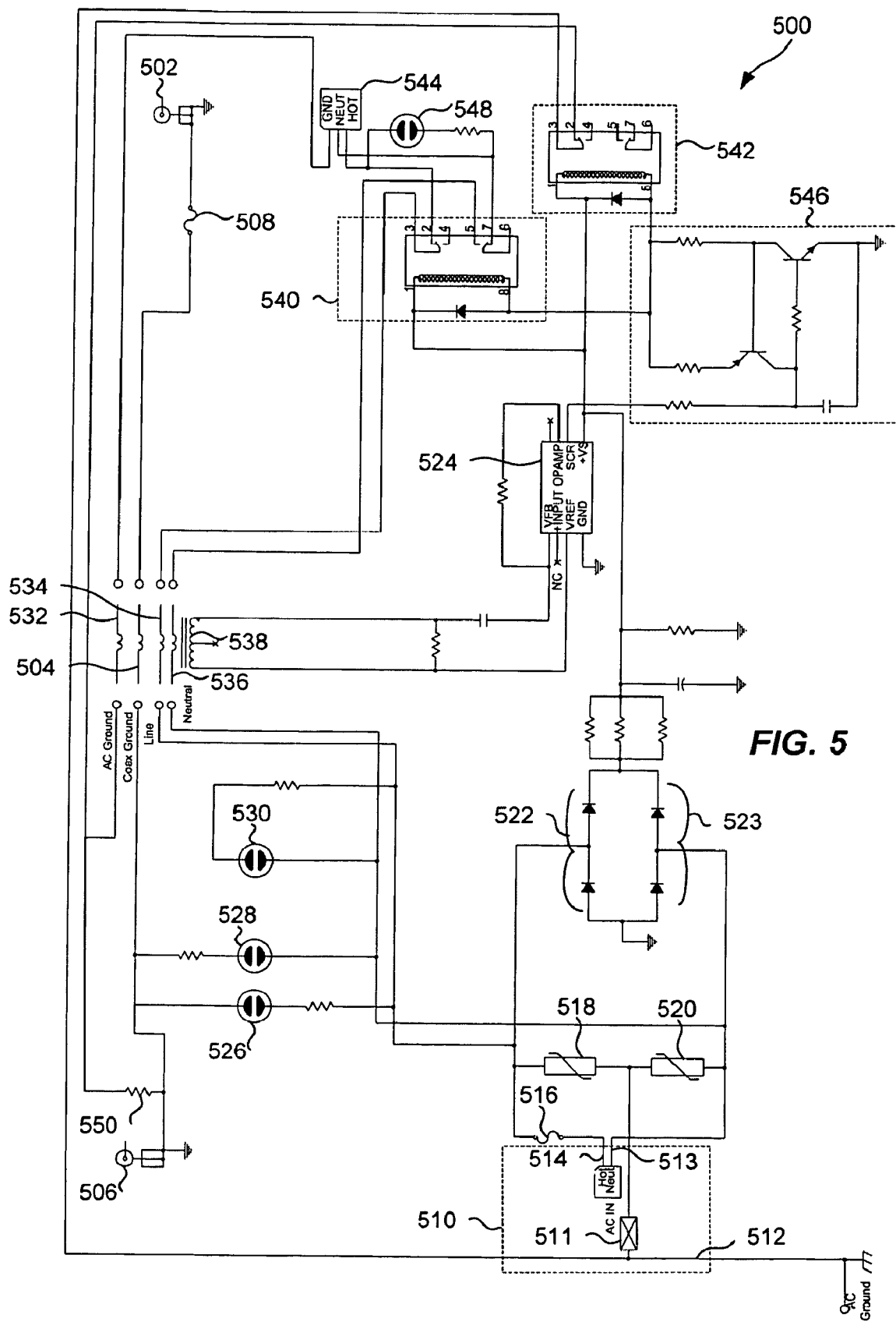
FIG. 5 illustrates an embodiment of a ground current detector.

FIG. 5 illustrates an embodiment of a ground current detector 500. The ground current detector 500 is configured to test for excessive or faulty ground currents and other problems encountered during the installation of satellite television systems and other electrical systems. The ground current detector 500 includes a first F-connector 502 that couples to a coaxial cable (not shown in FIG. 5). In at least one embodiment, the coaxial cable communicatively couples a satellite antenna to the first F-connector 502. Because the coaxial cable that couples to the first F-connector 506 is also communicatively coupled to an earth ground in the typical satellite television installation, the first F-connector 506 provides the ground current detector 500 with an earth ground potential. In at least one embodiment, a fuse 508 is placed in series with the first F-connector 502 to protect the ground current detector 500 from excessive or faulty currents provided by the coaxial cable to the first F-connector 502. The first F-connector 502 is further in signal communication with a coaxial ground current transformer 504. The functionality of the coaxial ground current transformer 504 will be described in further detail below.

In one embodiment, the coaxial ground current detector 504 is further communicatively coupled to an optional second F-connector 506 that couples the ground current detector 500 to another coaxial cable (not shown in FIG. 5). In this embodiment, the optional resistor jumper 550 connecting coaxial ground current detector 504 and the current transformer 532 is omitted. The second F-connector 506 is configured to provide the signal received by the first F-connector 502 to an electronic device, such as a set-top box (e.g., a satellite receiver), television and the like. In one embodiment, the second F-connector 506 may be omitted such that one end of the coaxial ground current transformer 504 is unloaded. In this embodiment, the optional resistor jumper 550 is utilized to connect the coaxial ground current detector 504 and the current transformer 532.

The ground current detector 500 further includes an AC input 510 with a ground line 512, a hot line 513 and a neutral line 514. The hot line 513 is communicatively coupled with a fuse that protects the ground current detector 500 from excessive currents that may potentially damage components of the ground current detector 500. The ground line 512, the hot line 513 and the neutral line 514 are further communicatively coupled to a plurality of metal oxide varistors (MOV) 518 and 520, and Gas-Discharge Tube arrestor (GDT) 511, that cooperatively operate to provide surge protection from AC input 510. In at least one embodiment, ground current detector 500 may be left in place after installation and utilized as a standard surge protector. The ground current detector 500 may be further connected to an alarm system to provide indications to use of faulty and/or excessive currents within a home wiring system.

The ground current detector 500 further includes a plurality of sets of diodes 522 and 523 configured to rectify the AC current from the hot line 513 and the neutral line 514 of the AC input 510 to a DC current for energizing the integrated circuit 524. The integrated circuit 524 is a standard GFCI integrated circuit utilized in wall outlets, extension cords and the like. The operation of the integrated circuit 524 will be described in further detail below.

The ground line 512, the hot line 513 and the neutral line 514 are each coupled to a current transformer 532, 534 and 536, respectively. Thus, a current from each line may be used as input to integrated circuit 524. More specifically, a current on any of current transformers 504, 532, 534 and 536 is proportionally translated by the secondary windings 538 to an input signal utilized by a comparison module of integrated circuit 524. In at least one embodiment, the secondary windings 538 may translate signals from the AC ground current transformer 532 and the coaxial ground current transformer 504 for input to the integrated circuit 524. In this embodiment, the integrated circuit may test for faulty or excessive currents in the AC ground line 512 (e.g., currents having a value exceeding a threshold).

In at least one embodiment, the secondary windings 538 may translate signals from the line transformer 534 and the neutral transformer 536 to an input signal utilized by the integrated circuit 524. In this embodiment, the integrated circuit 524 may test for an imbalance between the hot line 513 and the neutral line 514 (e.g., a ground fault condition). It is to be appreciated that any combination of inputs from current transformers 504, 532, 534 and 536 may be translated by the secondary windings 538 and utilized as input for processing by integrated circuit 524.

The ground current detector 500 further includes an AC output 544 communicatively coupled to the ground line 512, the hot line 513 and the neutral line 514. More specifically, the AC output 544 is coupled to the ground line 512, the hot line 513 and the neutral line 514 through one or more breaker circuits 540 and 542. Responsive to detecting an unsafe condition, the integrated circuit 524 provides a signal to the breaker circuit 540 and 542, which disconnects the ground line 512, the hot line 513 and/or the neutral line 514 from AC output 544. Thus, if a device is plugged into the AC output 544 for receiving current from an AC power source coupled to the ground current detector 500, then the device will be turned off until the unsafe condition is eliminated.

The ground current detector 500 further includes a latch circuit 546 adapted to store a signal indicating the detection of the unsafe condition. Once breaker circuits 540 and 542 are tripped, the latch circuit 546 stores an indication of the existence of the unsafe condition until the ground current detector 500 is reset. Thus, in at least one embodiment, a user may un-plug the AC input 510 from a wall outlet to reset the ground current detector 500. The ground current detector 500 may also include a reset button for resetting the latch circuit 546.

The ground current detector 500 further includes an indicator lamp 548 communicatively coupled to the breaker circuit 540. The indicator lamp 548 is configured to provide an indication to a user that the breaker circuit 540 has been tripped because of the detection of an unsafe condition. Thus, a user can take corrective action to eliminate the unsafe condition, and if desired proceed with additional testing and/or monitoring.

The ground current detector 500 further comprises a plurality of indicator lamps 526, 528 and 530 that are configured to provide indicators to a user regarding the state of each of the ground line 512, the hot line 513 and the neutral line 514. For example, a user may be alerted if the wiring of the neutral line 514 and the hot line 513 of the structure is reversed. The neon lamps 526, 528 and 530 thus perform a different testing/monitoring function than the ground current sensing functions of the integrated circuit 524. It is to be appreciated that these tests may be performed simultaneously when the ground current detector 500 is connected to an AC outlet and the ground block at the same time. In at least one embodiment, these testing/monitoring functions may also be performed separately depending on desired design criteria.

Figure 6:
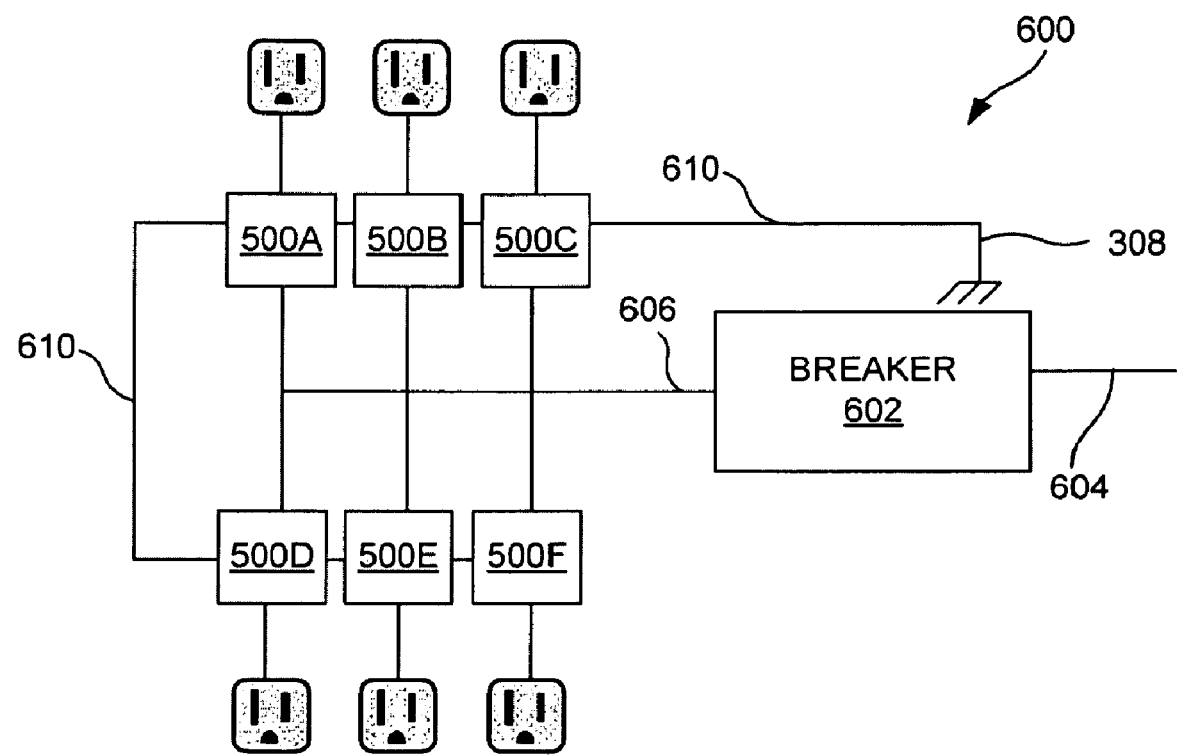
FIG. 6 illustrates a home wiring system 600 including the ground current detector of FIG. 5.

The ground current detector 500 may be utilized within home wiring to provide indication and/or surge protection against faulty or excessive AC currents. FIG. 6 illustrates a home wiring system 600 including multiple ground current detectors 500 of FIG. 5. Home wiring system 600 includes a breaker 602, a line source 604, wiring 606, an earth ground 308, a reference line 610, and a plurality of ground current detectors 500A-500F. Each of the components of the home wiring system 600 will be discussed in greater detail below. Further, home wiring system 600 may include other elements, components or devices not illustrated for the sake of brevity.

The breaker 602 receives an AC current from the line source 604. Wiring 606 is coupled to the breaker 602, and normally distributes the AC current to a plurality of outlets. In the embodiment illustrated in FIG. 6, the wiring is electrically coupled to each ground current detector 500A-500F. Each ground current detector is communicatively coupled to the earth ground 308 through reference source 610. The reference source 610 provides a known earth ground connection. The output 544 (see FIG. 5) of each ground current detector 500A-500F is electrically coupled to an outlet. The ground current detectors 500A-500F thus can measure the AC current from wiring 606 against a known earth ground 308 to detect faulty or excessive currents. Thus, each ground current detector 500A-500F can provide surge protection and/or indication responsive to detecting any faulty or excessive AC currents.

Figure 7:
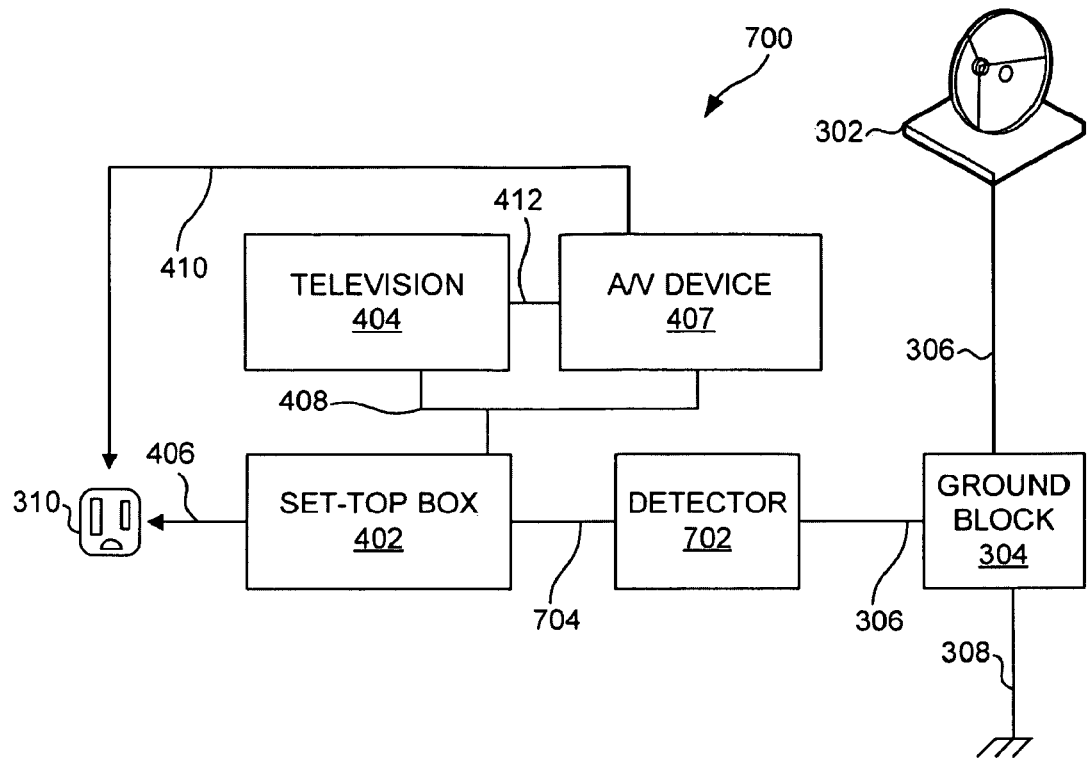
FIG. 7 illustrates an embodiment of a testing/monitoring environment.

FIG. 7 illustrates an embodiment of a testing/monitoring environment 700. More specifically, the testing/monitoring environment 700 illustrates a ground current detector 702 that can be placed in-line with a coaxial cable connection to test for excessive, faulty or leakage currents exiting an electronic device through a coaxial cable. The description of elements common to the testing/monitoring environment 300 of FIG. 3 and the testing/monitoring environment 400 of FIG. 4 is omitted for brevity of the discussion.

In testing/monitoring environment 700, the power plug 406 of the set-top box 402 is plugged into an AC wall outlet 310. A ground current detector 702 is communicatively coupled to an input port of the set-top box 402 through a coaxial cable 704. The input port of the set-top box 402 coupled to the coaxial cable would typically be connected to the satellite antenna 302. However, the ground current detector 702 is placed in-line with the coaxial cable between the satellite antenna and the set-top box 402.

The ground current detector 702 is further coupled to the satellite antenna 302 through the coaxial cable 306. The ground current detector 702 passes through signals from the coaxial cable 306, communicatively coupling the satellite antenna 302 with the set-top box 402. Because the ground current detector 702 is also communicatively coupled to the earth ground 308, a ground path is provided through ground current detector 702 to the earth ground 308 for excessive, faulty or leaking currents from the set-top box 402.

The ground current detector 702 is configured to detect for currents in excess of a threshold value. In at least one embodiment, the ground current detector 702 includes a push-pull breaker that is configured to break at a very lower current (e.g., 5 mA). Thus, when a current exceeding the threshold value (e.g., 5 mA) passes through the ground current detector 702, then the push-pull breaker disconnects the connection between the set-top box 402 and the satellite antenna 302. A user is provided with a visual indicator that an unsafe condition exists when the breaker on the ground current detector 702 trips. The tripping of the breaker temporarily eliminates the unsafe condition in the coaxial cables 306 and 704 until the user can take corrective action. Additionally, a user is alerted of the unsafe condition because the set-top box 402 will no longer be receiving a signal from the satellite antenna 302 for presentation on the television 404. In at least one embodiment, once the unsafe condition is eliminated, the ground current detector 702 may be removed and coaxial cable 306 may be connected directly to the input port of the set-top box 402.

Figure 8:
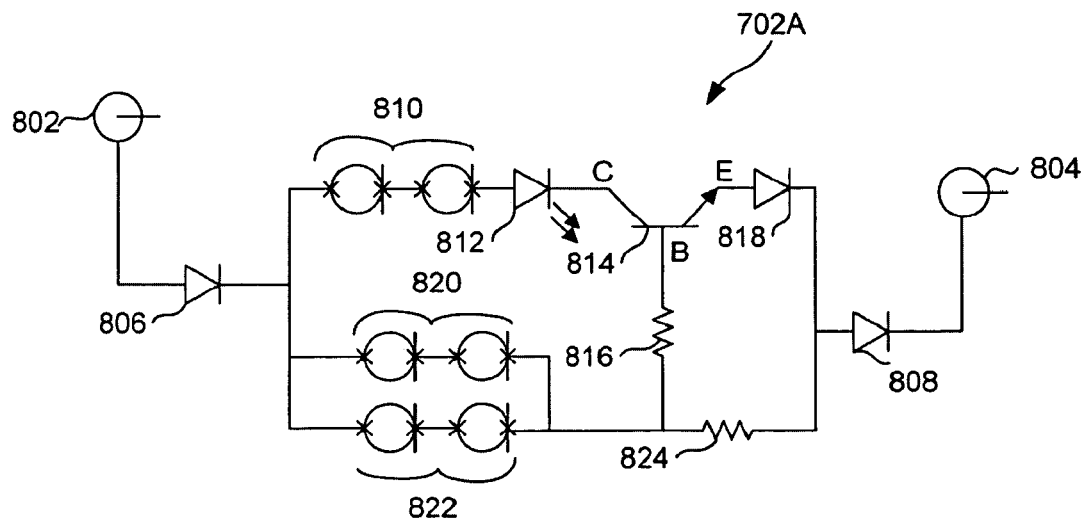
FIG. 8 illustrates an embodiment of a ground current detection device including a current limiting diode.

In at least one embodiment, the ground current detector 702 may include a current limiting diode that limits the amount of current that can pass through the ground current detector. FIG. 8 illustrates an embodiment of a ground current detector 802A of FIG. 7 including a current limiting diode. In at least one embodiment, the ground current detector 802A is configured to be placed in-line with a coaxial cable using coaxial F-connectors.

The ground current detector 802A includes a first F-connector 802 configured to couple a first coaxial cable or electronic device to the ground current detector 802A, and a second F-connector 804 configured to couple a second coaxial cable or electronic device to the ground current detector 802A. It is to be appreciated that either of F-connectors 802 and 804 may comprise male and/or female F-connectors depending on desired design criteria.

The first F-connector 802 is electrically coupled to a first blocking diode 806. The second F-connector 804 is electrically coupled to a second blocking diode 808. The first blocking diode 806 and the second blocking diode 808 are configured to block undesired current flows through the ground current detector 802A. In other words, blocking diodes 806 and 808 allow the current to flow in only one direction through ground current detector 802A.

The ground current detector 702 further comprises an LED 812, a transistor 814 and a resistor 816 that operate as an LED driver circuit. The transistor 814 is configured to activate the LED 812 when the voltage at the base of the transistor 814 reaches the turn-on voltage. The LED 812 provides an indicator to a user that an unsafe condition is detected by the ground current detector 802A. In at least one embodiment, the turn-on voltage of the transistor 812A corresponds to a selected current threshold condition of the ground current detector 802A. For example, the turn-on voltage of the transistor 814 may correspond to a current of 5 mA at the base of the transistor 814. Because the voltage at the base of the transistor 814 varies with the current passed through the ground current detector 802A, the ground current detector 802A can be configured such that the voltage at the base of the transistor 814 does not reach the turn-on voltage until a selected amount of current passes through the ground current detector 802A (e.g., the selected threshold).

The ground current detector 802A further comprises a first set of current limiting diodes 810 communicatively coupled to the LED 812. The first set of current limiting diodes 810 may include any number of current limiting diodes selected based on desired design criteria. The current limiting diodes 810 regulate the current passed through the LED 812 and the ground current detector 802A. Thus, if unsafe conditions occur, such as faulty, excessive or leaking currents, then the ground current detector 802A temporarily eliminates these conditions to avoid excessive amounts of current being passed through the ground current detector 802A. The ground current detector 802A further includes a blocking diode 818 communicatively coupled to the emitter of the transistor 814. This blocking diode 818 is configured to block undesired current flows through the transistor 814. In other words, blocking diode 818 prevents unwanted currents from entering the emitter of the transistor 814 from the node connecting elements 824, 808 and 818. Additionally, blocking diode 818 adds another diode drop that increases the "on" voltage threshold of the transistor 814.

The ground current detector 802A further includes at least one second set of current limiting diodes 820 and a resistor 824. The second set of current limiting diodes 820 may contain any number of current limiting diodes selected based on desired design criteria. The current limiting diodes 820 are configured to regulate the amount of current passed through the ground current detector 802A. Thus, if the regulation limit of the current limiting diodes 820 is 4.7 mA, then the ground current detector 802A will only pass through a current up to 4.7 mA.

In at least one embodiment, the ground current detector 802A may include a third set of current limiting diodes 822 connected in parallel with the second set of current limiting diodes 820 to provide a larger range of current regulation. For example, current limiting diodes 820 and 822 may be utilized to provide a maximum current flow of 9.4 mA versus the 4.7 mA limit provided by a single set of current limiting diodes 820. When the amount of current passed through current limiting diodes 820 and 822 is under a specified threshold (e.g., 5 mA), then the current passes through resistor 824 and exits ground current detector 802A through F-connector 804. However, once the current passing through current limiting diodes 820 and 822 reaches the specified threshold, then the voltage at the base of the transistor 814 will reach the turn-on voltage of the transistor 814, and a portion of the current passes to the transistor 814. Thus, the LED 812 is activated to provide an indication to a user that an unsafe condition exists.

Figure 9:
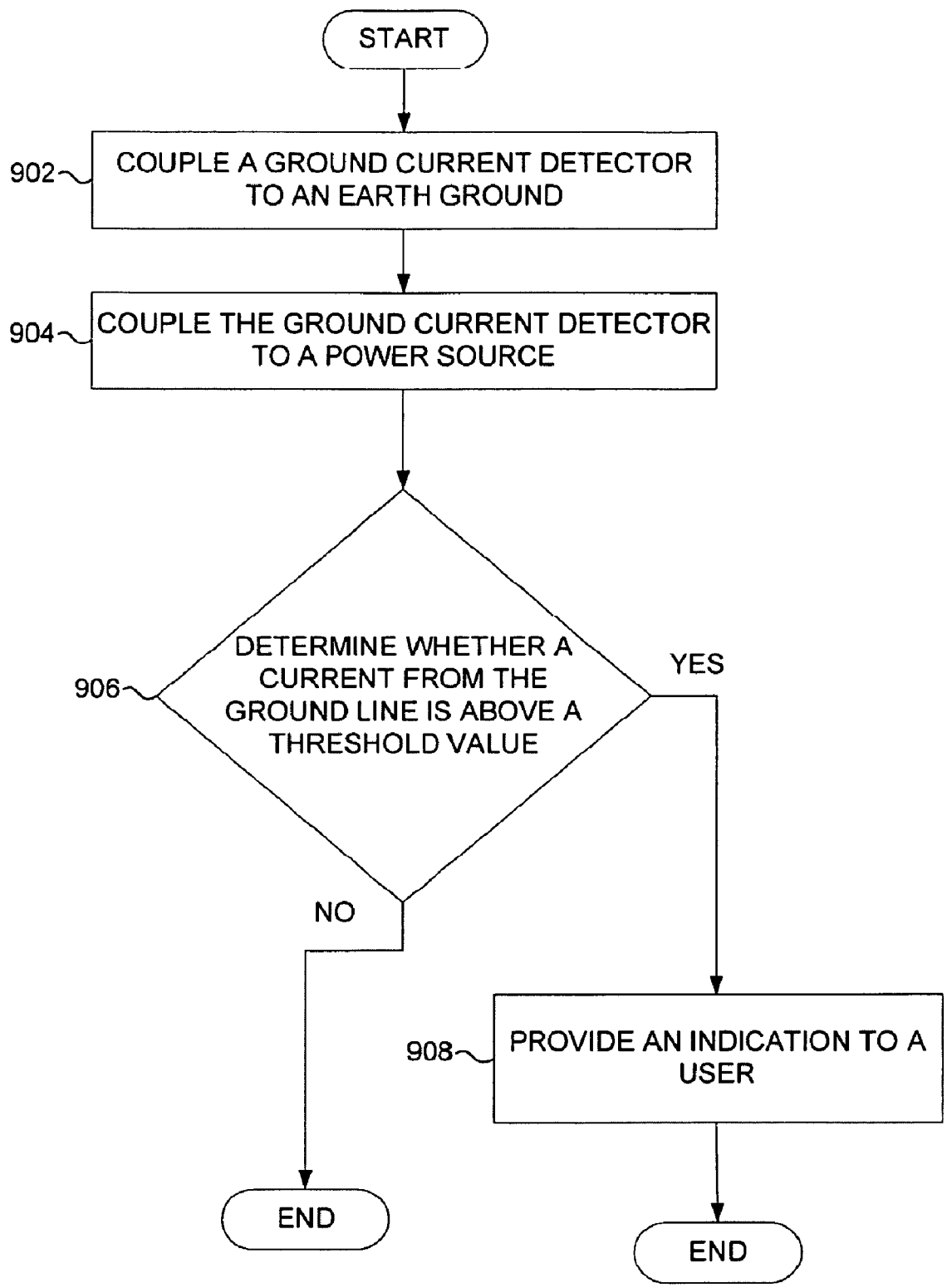
FIG. 9 illustrates an embodiment of a process for detecting an excessive ground current.

FIG. 9 illustrates an embodiment of a process for detecting an excessive ground current. More particularly, the process of FIG. 9 may be applied to test for improper wiring within a structure, e.g., an improper ground connection in an AC power outlet using a known properly wired earth ground connection. The operations of the process of FIG. 9 are not all-inclusive, and may comprise other operations not illustrated for the sake of brevity.

The process includes coupling a ground current detector to an earth ground (operation 902). In at least one embodiment, the earth ground is coupled to a cable providing an RF feed source (e.g., a satellite antenna signal). The ground current detector utilized in the process of FIG. 9 may include any type of testing/monitoring device having appropriate comparison logic for comparing one or more signals to a reference value. Several embodiments of ground current detectors are described in FIGS. 1-7. It is to be appreciated however that any type of testing/monitoring device may be utilized in the process described in FIG. 9.

The process further includes coupling the ground current detector to a power source (operation 904). In at least one embodiment, the ground current detector includes a three-prong AC power cord that may be plugged into an AC wall outlet found in most structures.

The process further includes determining whether a current from a ground line of the power source exceeds a threshold value based on the earth ground potential (operation 906). In at least one embodiment, the AC ground line is compared with the earth ground to determine whether a current in the AC ground line exceeds a threshold value. A current in the AC ground line exceeding the threshold value indicates an unsafe condition, such as a ground fault or mis-wiring in the structure.

If operation 906 determines that the current in the ground line does not exceed the threshold value, then the operation of the process is complete. Otherwise, the process further includes providing an indication that an unsafe condition exists in the ground line responsive to determining that the current exceeds the threshold value (operation 908). The indication may be provided by an LED, an LCD display, a mechanical switch indicator, an audible indicator or the like.

Figure 10:
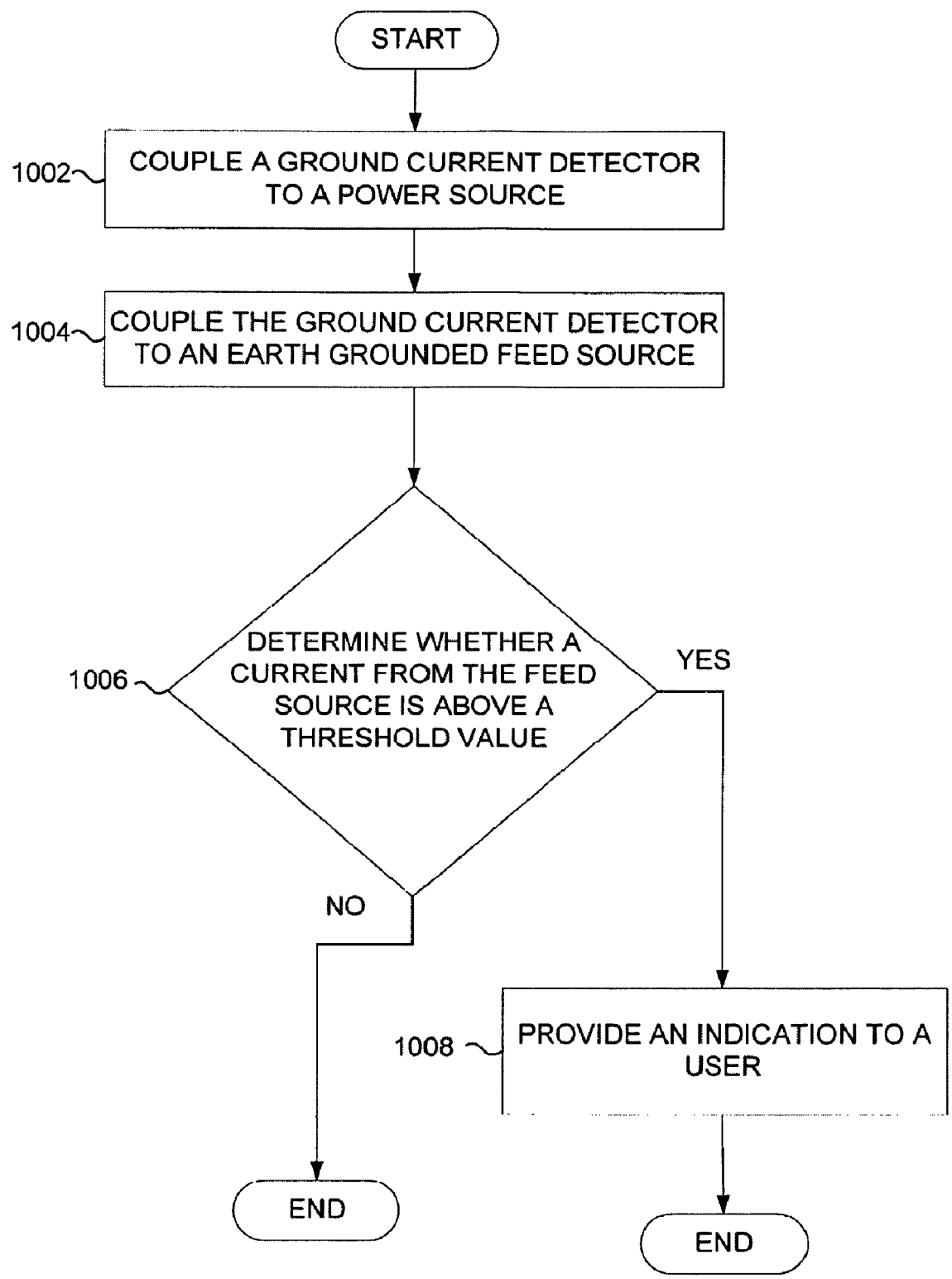
FIG. 10 illustrates an embodiment of a process for installing a satellite television system.

FIG. 10 illustrates an embodiment of a process for detecting an improper earth grounded feed source. More particularly, the process of FIG. 10 determines whether an earth grounded feed source is improperly grounded using another known ground source. The operations of the process of FIG. 10 are not all-inclusive, and may comprise other operations not illustrated for the sake of brevity.

The process includes coupling the ground current detector to a power source (operation 1002). The power source has a ground connection that is known to be properly wired. In at least one embodiment, the ground current detector includes a three-prong AC power cord that may be plugged into an AC wall outlet found in most structures. The ground prong of the AC power cord provides the known ground connection. The ground current detector utilized in the process of FIG. 10 may include any type of testing/monitoring device having appropriate comparison logic for comparing one or more signals to a reference value. Several embodiments of ground current detectors are described in FIGS. 1-7. It is to be appreciated however that any type of testing/monitoring device may be utilized.

The process further includes coupling a ground current detector to a feed source (operation 1004). In at least one embodiment, the feed source is connected to an earth ground. However, the earth ground connection may be improperly wired, and the ground current detector is utilized to determine whether the earth ground connection is properly wired.

The process further includes determining whether a current from the feed source exceeds a threshold value based on the ground line of the power source (operation 1006). In at least one embodiment, the AC ground line is compared with the earth grounded feed source to determine whether a current in the feed source exceeds a threshold value. A current in the feed source exceeding the threshold value indicates an unsafe condition, such as a ground fault or mis-wiring in the structure.

If operation 1006 determines that the current in the ground line does not exceed the threshold value, then the operation of the process is complete. Otherwise, the process further includes providing an indication that an unsafe condition exists in the improperly earth grounded feed source responsive to determining that the current exceeds the threshold value (operation 1008). The indication may be provided by an LED, an LCD display, a mechanical switch indicator, an audible indicator or the like.

Figure 11:
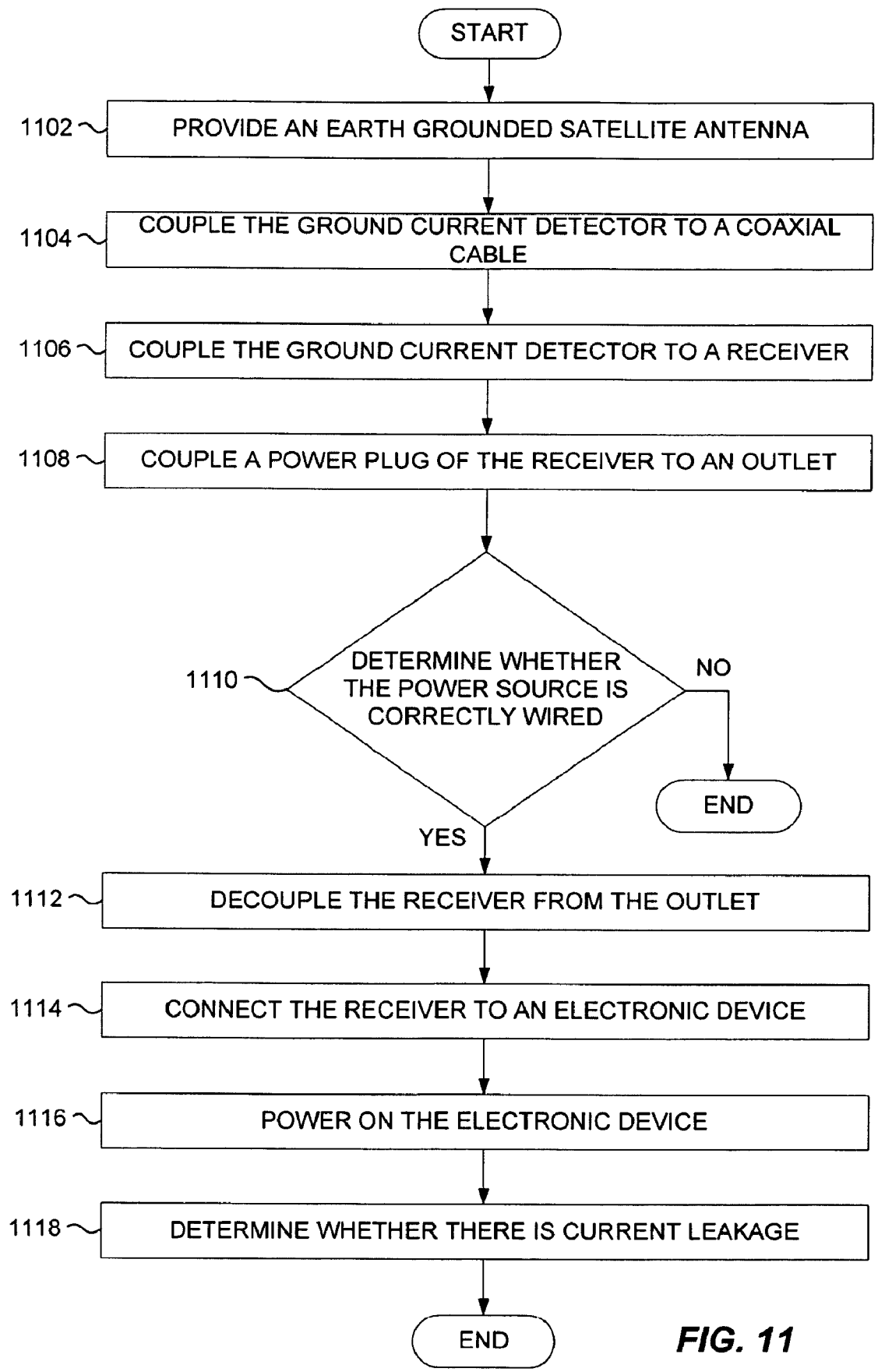
FIG. 11 illustrates an embodiment of a process for detecting an improper earth grounded feed source.

FIG. 11 illustrates an embodiment of a process for installing a satellite television system. While the process of FIG. 11 is illustrated in the context of the installation of a satellite television system, it is to be appreciated that the process can be applied to installation of other electronic systems, such as cable television systems. The operations of the process of FIG. 11 are not all-inclusive, and may comprise other operations not illustrated for the sake of brevity.

The process includes providing a satellite antenna electrically coupled to an earth ground through a coaxial cable (operation 1102). In at least one embodiment, operation 1102 may include installing a satellite antenna on a rooftop, pole or other appropriate location, and connecting a coaxial cable to the satellite antenna. Operation 1102 may further include grounding the coaxial cable using an appropriate grounding location of the structure, such as a ground block. It is to be appreciated that in at least one embodiment, operation 1102 may include providing an earth grounded coaxial cable that is in signal communication with a cable television system rather than a satellite antenna.

The process further includes coupling a first input of a ground current detector to the coaxial cable (operation 1104).

In at least one embodiment, the ground tester includes a female F-connector for coupling to a male F-connector of the coaxial cable. The ground current detector utilized in the process of FIG. 11 may include any type of testing/monitoring device having appropriate comparison or detection logic for comparing one or more signals to a reference value. Several embodiments of ground current detectors are described in FIGS. 1-7. It is to be appreciated however that any type of testing/monitoring device may be utilized.

The process further includes coupling a second input of the ground current detector to a satellite receiver (operation 1106). It is to be appreciated that other types of receivers and set-top boxes may also be utilized in place of the described satellite receiver. In at least one embodiment, the ground current detector may be coupled to the satellite receiver through an intermediate coaxial cable. Thus, the ground tester may include a female F-connector for coupling to a male F-connector of the coaxial cable. In at least one embodiment, the ground current detector may couple directly to the satellite receiver, and may include a male F-connector for coupling to a female F-connector of the satellite receiver.

The process further comprises coupling a power plug of the satellite receiver to an outlet of a power source (operation 1108). In at least one embodiment, an AC ground line of the power source is compared with the earth ground to determine whether a current in the AC ground line exceeds a threshold value.

If operation 1110 determines that the current in the ground line exceeds the threshold value, then the operation of the process is ended, and a user may take corrective action to fix the wiring of the structure before the installation of the satellite television system continues.

Otherwise, the process further includes decoupling the power plug of the satellite receiver from the outlet of the power source responsive to determining that the power source is correctly wired (operation 1112). In at least one embodiment, the satellite receiver remains unplugged during the remaining duration of the installation process.

The process further comprises connecting the satellite receiver to at least one other electronic device (operation 1114). Exemplary electronic devices utilized in the context of a satellite television installation include a television, stereo, DVD player, DVR and video game console. Each electronic device may be connected to the satellite receiver through an appropriate A/V connection. For example, the television may be connected to the satellite receiver through a coaxial or HDMI connection, and a DVD player may be connected to the satellite receiver through a composite video connection.

The process further includes powering on the electronic devices connected to the satellite receiver (operation 1114), and utilizing the ground current detector to determine whether there is any current leakage from the electronic devices into the satellite receiver (operation 1116). In at least one embodiment, the ground current detector determines whether there is current leakage by detecting currents leaving the set-top box from the coaxial connection coupled to the ground current detector. More specifically, the ground current detector detects the presence of currents leaving the coaxial connection of the set-top box that exceed a specified threshold value (e.g., 5 mA). It is to be appreciated that the threshold value in operation 1114 may be the same as or different than the threshold value utilized in operation 1110.

If leakage currents are detected, a user may take corrective action to locate and eliminate the presence of these leakage currents. In at least one embodiment, once the leakage currents are removed, the ground current detector can be decoupled from the satellite receiver, and the satellite receiver can be coupled to the satellite antenna through the coaxial cable. Once this process is complete, the satellite receiver can be plugged into the power source, and the installation process is complete. In at least one embodiment, the ground current detector may also be left in place for ongoing monitoring purposes.

Figure 12:
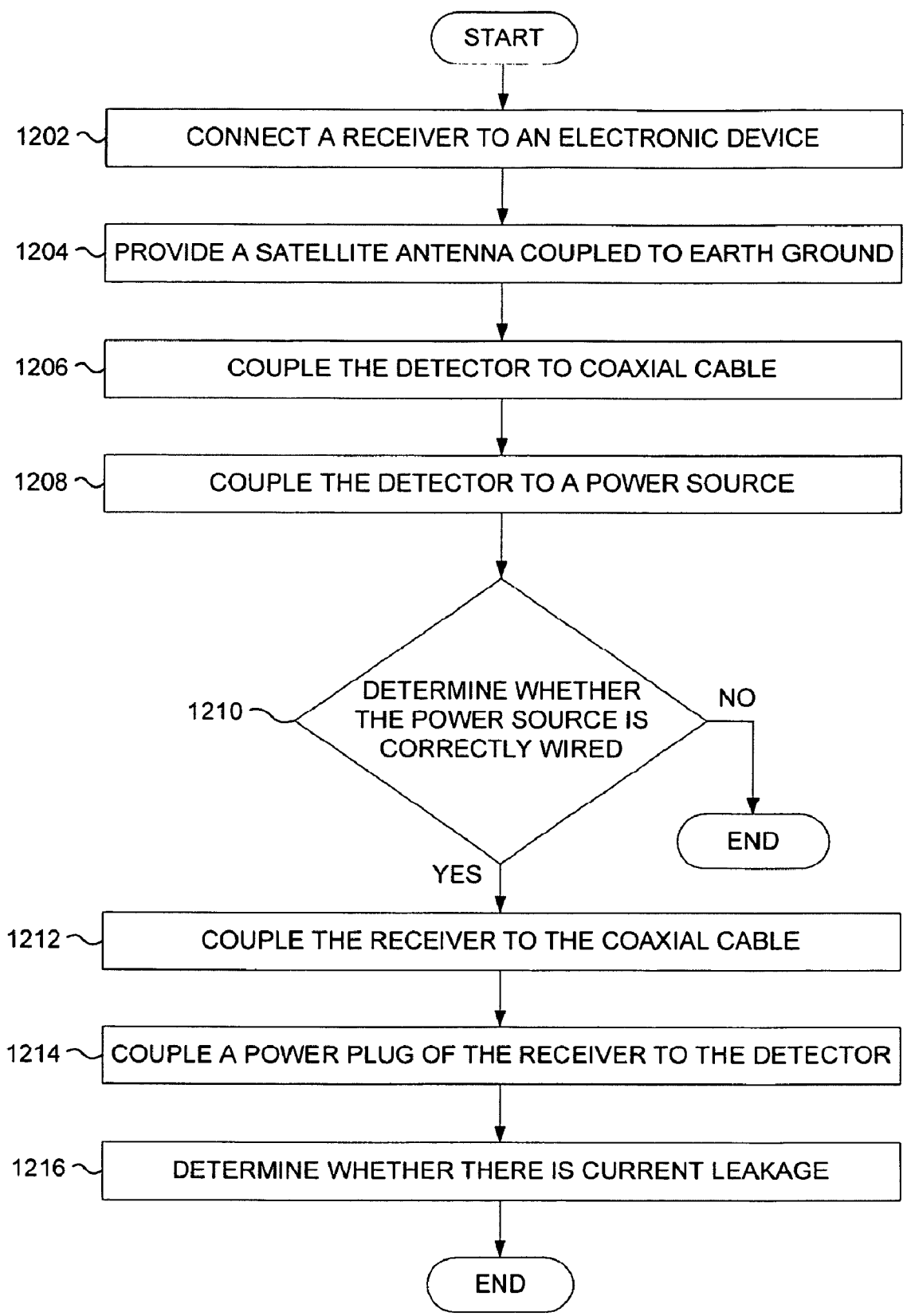
FIG. 12 illustrates an embodiment of a process for installing a satellite television system.

FIG. 12 illustrates an embodiment of a process for testing and/or installing a satellite television system. While the process of FIG. 12 is illustrated in the context of the installation of a satellite television system, it is to be appreciated that the process can be applied to installation of other electronic systems in which an electronic or electrical signal is provided to the electronic device through a separately grounded cable. For example, the testing process may be applied to cable television systems, RF antennas or separate power lines for household appliances (e.g., air conditioners, stoves, dishwashers and the like). Thus, the testing process may be applied to the wiring of any structure by connecting the device to a circuit that is connected to a known good ground, determining whether the wiring of the structure is properly grounded. The operations of the process of FIG. 12 are not all-inclusive, and may comprise other operations not illustrated for the sake of brevity.

The process includes connecting a satellite receiver to at least one other electronic device (operation 1202). In at least one embodiment, operation 1202 may be performed as described in operation 1114 of FIG. 11. It is also to be appreciated that operation 1202 may be performed before or after any of subsequently described operations 1202 through 1214.

The process further includes providing a satellite antenna electrically coupled to an earth ground through a coaxial cable (operation 1204). In at least one embodiment, operation 1204 may be performed as described in operation 1102 of FIG. 11.

The process further includes coupling a ground current detector to the coaxial cable (operation 1206). In at least one embodiment, operation 1206 may be performed as described in operation 1104 of FIG. 11.

The process further includes coupling the ground current detector to an AC power source (operation 1208). In at least one embodiment, the ground current detector includes a three-prong AC power cord that may be plugged into an AC wall outlet found in most structures.

The process further includes utilizing the ground current detector to determine whether the power source is correctly wired (operation 1210). In at least one embodiment, the AC ground line is compared with the earth ground potential to determine whether a current in the AC ground line exceeds a threshold value. A current in the AC ground line exceeding the threshold value indicates an unsafe condition, such as a ground fault or mis-wiring in the structure.

If operation 1210 determines that the current in the ground line exceeds the threshold value, then the operation of the process is ended, and a user may take corrective action to fix the wiring of the structure before the installation of the satellite television system continues.

Otherwise, the process further includes coupling the satellite receiver to the coaxial cable responsive to determining that the AC power source is correctly wired (operation 1212). The ground current detector is therefore disconnected from the coaxial cable connection to allow coupling of the satellite receiver to the satellite antenna.

The process further includes coupling a power plug of the satellite receiver to an AC outlet of the ground current detector responsive to determining that the AC power source is correctly wired (operation 1214), and utilizing the ground current detector to determine whether there is any current leakage from the other electronic devices into the satellite receiver (1216).

The method optionally may include powering on the electronic devices prior to performing operation 1216. If leakage currents are detected, a user may take corrective action to locate and eliminate the presence of these leakage currents. In at least one embodiment, once the leakage currents are removed, the ground current detector can be de-coupled from the satellite receiver, and the satellite receiver can be coupled to the satellite antenna through the coaxial cable. In at least one embodiment, the ground current detector may also be left in place for ongoing monitoring purposes. Once this process is complete, the satellite receiver can be plugged into the power source, and the installation process is complete.

Although specific embodiments were described herein, the scope of the invention is not limited to those specific embodiments. The scope of the invention is defined by the following claims and any equivalents therein.

What is claimed is:

1. A ground current detection apparatus comprising:
   a first input in signal communication with an earth ground connection, wherein the first input comprises a coaxial input;
   a second input in signal communication with a ground line of a power source; and
   a detection circuit communicatively coupled to the first input and the second input, which receives a ground signal from the second input, and determines whether a value of a current of the ground signal is above a threshold value, based on the earth ground connection, and provides an indication to a user responsive to determining that the value of the current of the ground signal is above the threshold value, wherein the detection circuit further comprises:
   a transformer including:
      first primary windings communicatively coupled to the first input;
      second primary windings communicatively coupled to the second input; and
      secondary windings electrically coupled to the first primary windings and the second primary windings and configured to translate the current of the ground signal from the second primary windings into a translated signal; and
   a comparison module communicatively coupled to the secondary windings to receive the translated signal as input, and to determine whether the value of the current of the ground signal exceeds a threshold value based on the translated signal.

2. The ground detection apparatus of claim 1 further comprising a coaxial output communicatively coupled to the coaxial input and configured to provide a signal received by the coaxial input to an electronic device in signal communication with the coaxial output.

3. The ground current detection apparatus of claim 1, wherein the coaxial input communicatively couples the first input to a satellite antenna.

4. The ground current detection apparatus of claim 1 further comprising:
   a power plug configured to couple to the power source, the power plug communicatively coupling the second input to the ground line of the power source;
   a power output configured to communicatively couple to and energize an electronic device; and
   a breaker circuit communicatively coupling the power plug to the power output, the breaker circuit configured to break the connection between the power plug and the power output responsive to the detection circuit determining that the value of the current of the ground signal exceeds a threshold value.

* * * * *